United States Patent
Qi et al.

(10) Patent No.: US 6,649,445 B1
(45) Date of Patent: Nov. 18, 2003

(54) WAFER COATING AND SINGULATION METHOD

(75) Inventors: Jing Qi, Schaumburg, IL (US); Janice Danvir, Arlington Heights, IL (US); Tomasz Klosowiak, Glenview, IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/241,265

(22) Filed: Sep. 11, 2002

(51) Int. Cl.[7] .......................... H01L 21/44; H01L 21/46
(52) U.S. Cl. ...................... 438/108; 438/114; 438/462; 438/465
(58) Field of Search ............................... 438/106, 108, 438/112, 113, 114, 462, 465

(56) References Cited

U.S. PATENT DOCUMENTS

| | | | |
|---|---|---|---|
| 5,128,746 A | 7/1992 | Pennisi et al. | 357/72 |
| 5,925,936 A | 7/1999 | Yamaji | 257/787 |
| 6,107,164 A | * 8/2000 | Ohuchi et al. | 438/465 |
| 6,168,972 B1 | 1/2001 | Wang et al. | 438/108 |
| 6,171,887 B1 | 1/2001 | Yamaji | 438/106 |
| 6,184,109 B1 | * 2/2001 | Sasaki et al. | 438/464 |
| 6,194,788 B1 | 2/2001 | Gilleo et al. | 257/789 |
| 6,323,062 B1 | 11/2001 | Gilleo et al. | 438/114 |
| 6,352,881 B1 | * 3/2002 | Nguyen et al. | 438/108 |
| 6,524,890 B2 | * 2/2003 | Ueda et al. | 438/113 |
| 6,534,387 B1 | * 3/2003 | Shinogi et al. | 438/465 |
| 2001/0055856 A1 | * 12/2001 | Tao | 438/462 |
| 2002/0014703 A1 | 2/2002 | Capote et al. | 257/778 |
| 2002/0068453 A1 | 6/2002 | Grigg et al. | 438/690 |

* cited by examiner

*Primary Examiner*—Carl Whitehead, Jr.
*Assistant Examiner*—David S Blum
(74) *Attorney, Agent, or Firm*—Daniel K. Nichols

(57) ABSTRACT

A method for providing an underfill material on an integrated circuit chip at the wafer level. The wafer (10) typically contains one or more integrated circuit chips (12), and each integrated circuit chip typically has a plurality of solder bumps (34) on its active surface. The wafer is first diced (22) on the active surface side to form channels (38) that will ultimately define the edges (39) of each individual integrated circuit chip, the dicing being of such a depth that it only cuts part-way through the wafer. The front side (36) of the wafer is then coated (24) with an underfill material (40). Generally, a portion (45) of each solder bump remains uncoated, but in certain cases the bumps can be completely covered. The back side of the wafer is then lapped, ground, polished or otherwise treated (26) so as to remove material down to the level of the previously diced channels. This reduction in the thickness of the wafer causes the original diced channels to now extend completely from the front side to the back side of the wafer. The wafer is then singulated (28) by cutting the underfill material (92) that was deposited in the channels during the coating step, so that the integrated circuit chip (12) is released from the wafer, and the underfill material that was coated on the active side remains affixed to the active surface of each individual integrated circuit chip.

27 Claims, 3 Drawing Sheets

WAFER COATING AND SINGULATION METHOD

FIELD OF THE INVENTION

This invention relates generally to a wafer-level method of providing an underfill material on flip chip integrated circuits. More particularly, the present invention relates to a method in which a bumped wafer is partially diced prior to the application of a polymeric underfill material.

BACKGROUND OF THE INVENTION

There are a number of conventional processes for packaging integrated circuits. One approach which is commonly referred to as "flip chip" packaging generally contemplates forming solder bumps (or other suitable contacts) directly on the contact pads formed on an integrated circuit die. The die is then typically attached to a substrate such as a printed circuit board so that the die contacts directly connect to corresponding contacts on the substrate. The solder bumps are then reflowed to electrically connect the die to the substrate. When a flip chip is attached to the substrate, an air gap typically remains between flip chip and substrate. This gap is commonly filled with material that is flowed into the gap in liquid form and then solidified. This material is typically a mixture of a resin and small silica spheres and is generally referred to as underfill, as it fills the gap under the chip. The underfill material is applied in liquid form from a dispenser at one edge of the flip chip. The underfill material then flows into the air gap and spreads across the flip chip until finally the entire area of the gap between flip chip and substrate is filled.

There are problems associated with underfill. For example, the application of underfill must be repeated for each flip chip, and repeating this operation many times adds to the cost of manufacture. Also, as the underfill material flows past solder bumps to fill the gap, separation of glass from resin may occur. This segregation of silica and resin alters the mechanical properties of the filled region and thereby negates the mechanical function of the underfill.

Recently, advances have been made which improve and streamline the underfill process. One method that has shown some commercial interest involves dispensing underfill before assembling the flip chip to the board. While simplifying the flip chip process, it still requires extra steps and cannot be run on a standard surface mount assembly line. Another approach to solving these problems appears in U.S. Pat. No. 6,323,062 where a method for applying an underfill and edge coating to a flip chip is described. The method includes the steps of adhering a bumped wafer to an expandable carrier substrate, sawing the wafer to form individual chips, stretching the carrier substrate in a bidirectional manner to form channels between each of the individual chips, applying an underfill material to the bumped surfaces of the chips and around the edges of the chips, cutting the underfill material in the channels between the chips and removing the individual, underfill coated chips from the carrier. Unfortunately, this method suffers from the need to precisely control the bidirectional stretching of the carrier film, which is difficult to implement, and introduces new issues such as out of plane die.

In spite of the numerous advantages provided by flip chip technology, a need still exists for a lower cost underfill application process for flip chips which simplifies the application of the critical underfill, and reduces the number of process steps required.

BRIEF DESCRIPTION OF THE DRAWINGS

The features of the invention believed to be novel are set forth with particularity in the appended claims. The invention itself however, both as to organization and method of operation, together with objects and advantages thereof, may be best understood by reference to the following detailed description of the invention, which describes certain exemplary embodiments of the invention, taken in conjunction with the accompanying drawings in which:

DETAILED DESCRIPTION OF THE INVENTION

Figure 1:
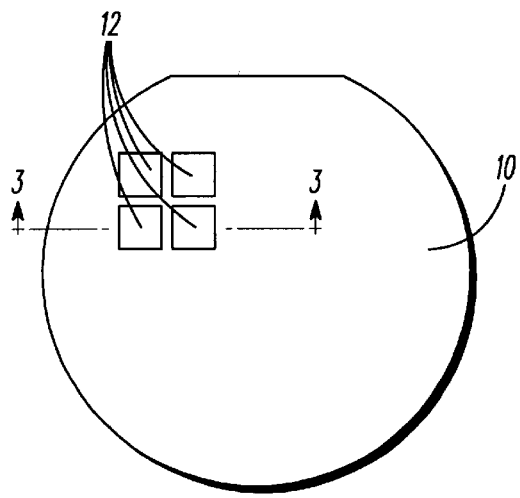
FIG. 1 is a plan view of a wafer containing one or more integrated circuit flip chips in accordance with the present invention.

While this invention is susceptible of embodiment in many different forms, there is shown in the drawings and will herein be described in detail specific embodiments, with the understanding that the present disclosure is to be considered as an example of the principles of the invention and not intended to limit the invention to the specific embodiments shown and described. In the description below, like reference numerals are used to describe the same, similar or corresponding elements in the several views of the drawings. The terms a or an, as used herein, are defined as one or more than one. The term plurality, as used herein, is defined as two or more than two. The term another, as used herein, is defined as at least a second or more. The terms including and/or having, as used herein, are defined as comprising (i.e., open language).

A novel method is described for providing an underfill material on an integrated circuit chip at the wafer level. The wafer typically contains one or more integrated circuit chips, and each integrated circuit chip typically has a plurality of solder bumps on its active surface. The wafer is first diced on the active surface side to form channels that will ultimately define the edges of each individual integrated circuit chip, the dicing being of such a depth that it only cuts part-way through the wafer. The front side of the wafer is then coated with an underfill material. Generally, a portion of each solder bump remains uncoated, but in certain cases the bumps can be completely covered. The back side of the wafer is then lapped, ground, polished or otherwise treated so as to remove material down to the level of the previously diced channels. This reduction in the thickness of the wafer causes the original diced channels to now extend completely from the front side to the back side of the thinned wafer. The wafer is then singulated by cutting the underfill material that was deposited in the channels during the coating step, so that the integrated circuit chip is released from the wafer, and the underfill material that was coated on the active side remains affixed to the active surface of each individual integrated circuit chip.

Figure 2:
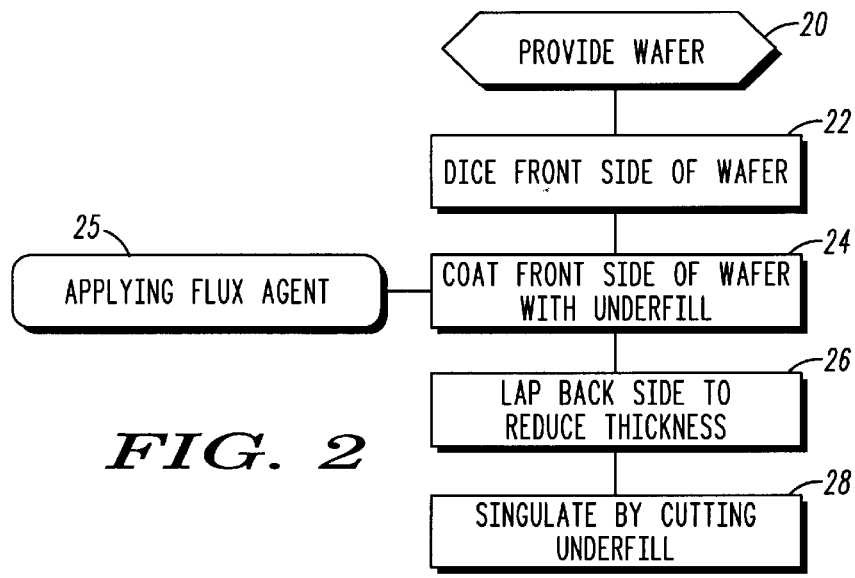
FIG. 2 is a flowchart detailing the process for providing an underfill material on an integrated circuit chip in accordance with certain embodiments of the present invention.
Figure 3:
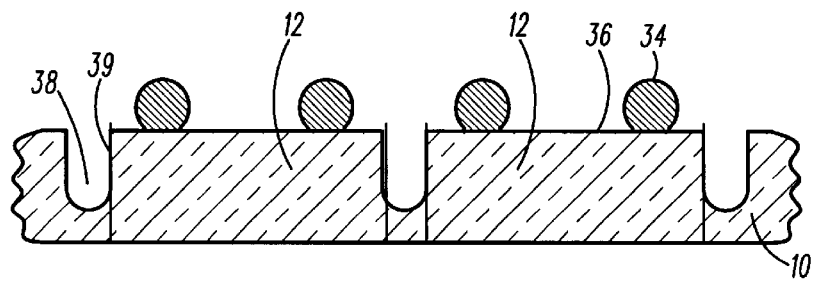
FIGS. 3–11 are cross-sectional views of a portion of the wafer depicted in FIG. 1, in accordance with the present invention.
Figure 4:
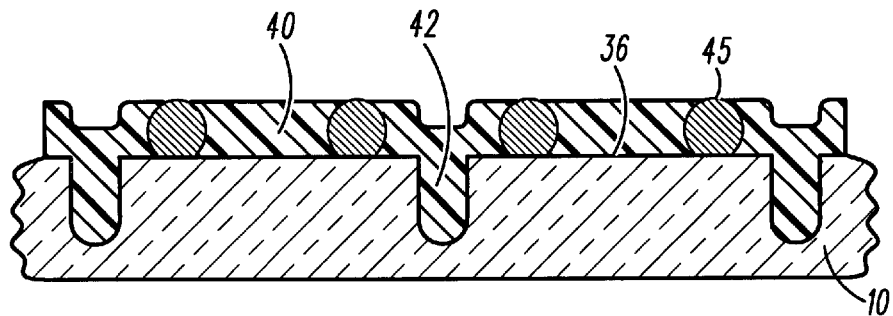
Figure 5:
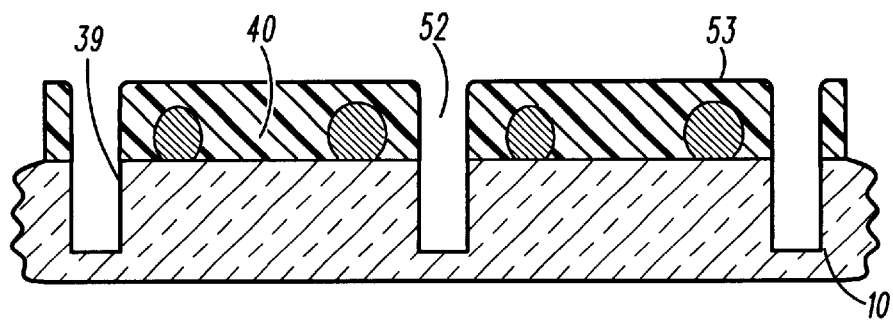

Referring now to FIGS. 1–11, a wafer 10 contains one or more integrated circuit (IC) chips 12 patterned on a front or active side 36 thereof. The wafer is typically a silicon wafer, but can also consist of other materials used to make ICs, such as gallium arsenide. As in the conventional art, the IC chips are patterned in an array, typically orthogonal, and each of the ICs is pre-bumped. That is, a bump 34, typically a solder ball, has been applied to at least some of the contact pads on the IC. The process and nomenclature of bumping wafers is well known to those of ordinary skill in the art of flip chip packaging, and will not be further elaborated upon here for sake of brevity. In the flowchart of FIG. 2, the first step 20 is that of providing the wafer just described. In the next step, 22, the wafer is diced or sawn on the front or active side, as depicted in FIG. 3. However, unlike the prior art, the wafer is not cut completely through, and the step of sawing 22 is performed so that the depth of the channels or grooves 38 formed in the wafer is such that they only extend part-way through the thickness of the wafer. Since the cuts formed by the dicing step do not extend completely through the thickness of the wafer, this leaves the wafer intact and in one piece, with the channels 38 defining what will ultimately become the edges or sides 39 of each individual flip chip 12.Referring now to FIG. 4, an underfill material 40 is applied to the active surface 36 of each IC on the wafer in step 24. The application of underfill can be provided in a myriad of ways that are common to the art of coating and semiconductor processing. For example, one can dip, spray, flood coat, spin coat, or curtain coat a liquid solution of the underfill material onto the wafer, or the underfill material can be selectively applied by stenciling or printing. After applying a liquid solution of underfill, it obviously must be treated in such a way as to render it at least semi-solid, for example, by heating to remove residual solvents, or if it is a high solids material, by partially curing it to convert it from a liquid to a solid. Some underfill materials that we find useful are epoxies, polyimides, and silicone-polyimide copolymers. If the underfill material is mass coated onto the surface of the wafer, as in dipping, spraying, flood coating, spin coating, or curtain coating liquid solutions, then it will at least partially fill 42 the channels that were cut in the wafer surface. The coating 42 in the channels serves to also coat all the edges of each IC.

Optionally, the underfill material 40 can be applied as a solid film, laminated onto the active surface of the wafer. Normally, the underfill material is applied such that at least a portion 45 of the surface of the bumps are left uncoated so that when the flip chip is ultimately assembled onto a printed circuit board, it will solder more easily. However, we also contemplate in FIG. 5 that our invention can be used in a manner where the bumps are completely covered 53 with the underfill material and the bumps 'solder through' the underfill during the flip chip assembly step. For example, an underfill material containing a fluxing agent that is useful in this embodiment is described in U.S. Pat. No. 5,128,746 "Adhesive and Encapsulant Material With Fluxing Properties". In another embodiment shown in FIG. 5, if the underfill material 40 is selectively applied by stenciling or printing or laminating, then there would be little, if any, underfill material 52 in the channels, and thus there would be no underfill material on the edges 39 of the ICs.

Figure 6:
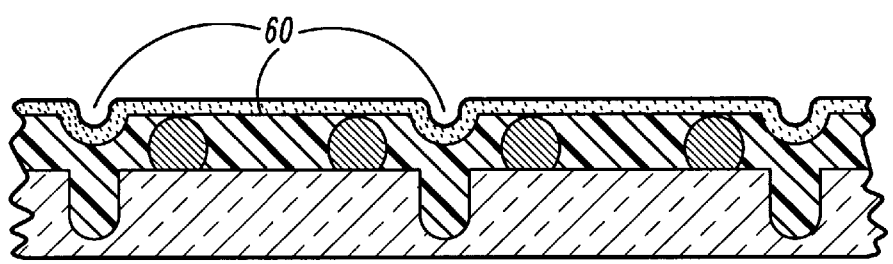
Figure 7:
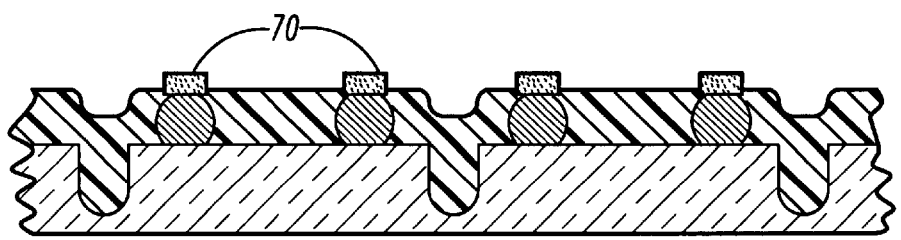

An optional step 25, depicted in FIGS. 6 and 7, can be employed wherein a fluxing agent 60 is applied on top of the underfill material and the exposed portion of the solder bumps to aid in the soldering process during assembly to the printed circuit board. The fluxing agent can be applied over the entire surface 60, or it can be selectively applied 70 only on the exposed portion of the solder bumps. There are many well known fluxing agents in the electronics industry, as well as methods of application.

Figure 8:
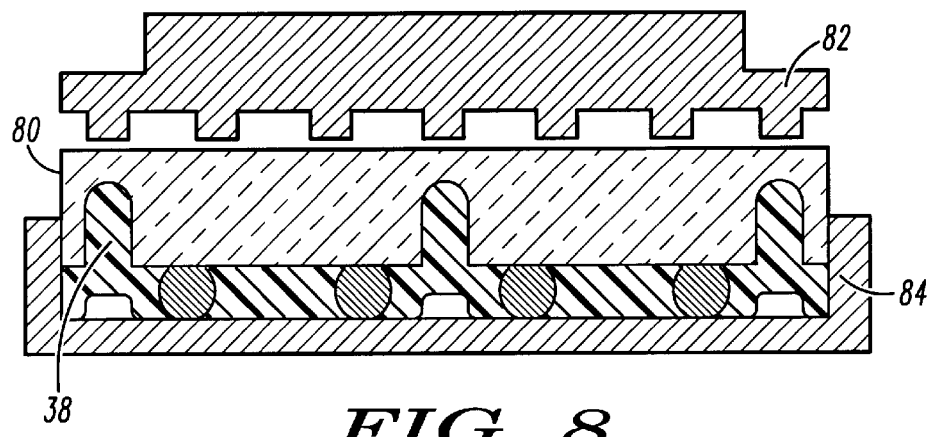
Figure 9:
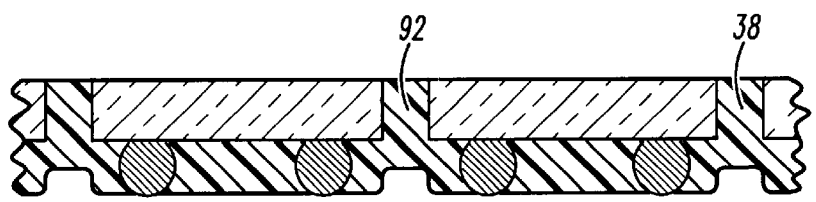
Figure 10:
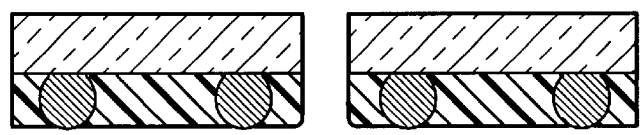
Figure 11:
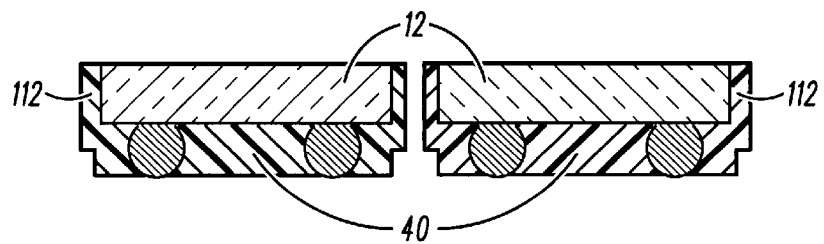

Continuing on, in the next step 26 depicted in FIG. 8, the wafer is placed active side down in a proper holding fixture 84 and the back side 80 (i.e. the side opposite the active side or the bumped side) is then lapped. Lapping is a well known process of removal of some of the semiconductor wafer material to reduce the thickness of the wafer by a carefully controlled amount by moving the wafer across a flat plate 82 on which a liquid abrasive has been poured. Back lapping is well known in the semiconductor industry. Other methods of material removal such as grinding or polishing are also contemplated as equivalents. The lapping process continues until sufficient material has been removed from the back side of the wafer so that the channels 38 that were originally cut so as to only partially extend into the wafer, now traverse completely through the wafer from the front side to the back side as shown in FIG. 9. If one has followed the process embodiment depicted in FIG. 5 where underfill material is not deposited in the channels 38, then when the thickness of the wafer is reduced sufficiently so that the channels extend completely from front to back, the individual IC chips have been singulated by the act of lapping, as shown in FIG. 10, and no further processing is necessary. However, if underfill material has been deposited in the channels, then a step of singulating 28 is performed by cutting through the underfill material 92 remaining in the channels. This can be performed from the active side or from the back side of the IC, and is typically accomplished by use of a laser (excimer, UV, $CO_2$ or other type) or by mechanically cutting or sawing. Referring now to FIG. 11, after the material 92 in the channels has been cut, the individual IC chips 12 are free, and each chip has underfill material 112 on the edges that were defined during the step of dicing 22, since this secondary cut is typically narrower than the original dicing cut. In both embodiments, the underfill material 40 deposited on the active surface during step 24 remains on the active surface of the flip chip IC 112 after it has been singulated from the wafer.

In summary, our invention, as described in embodiments herein, is implemented by dicing a wafer on the active surface to form channels that ultimately define the edges of each individual integrated circuit chip, the dicing being of such a depth that it only cuts part-way through the wafer. The front side of the wafer is then coated with an underfill material. Generally, a portion of each solder bump remains uncoated, but in certain cases the bumps can be completely covered. The back side of the wafer is then lapped, ground, polished or otherwise treated so as to remove material down to the level of the previously diced channels. This reduction in the thickness of the wafer causes the original diced channels to now extend completely from the front side to the back side of the wafer. The wafer is then singulated by cutting any underfill material that was deposited in the channels during the coating step, so that the integrated circuit chip is released from the wafer, and the underfill material that was coated on the active side remains affixed to the active surface of each individual integrated circuit chip. However, those skilled in the art will appreciate that the processes described above can be implemented in any number of variations without departing from the present invention.

In the illustrations above, multiple embodiments have been elucidated. Other combinations and permutations of these embodiments will occur to those skilled in the art upon consideration of the teachings herein. Those skilled in the art will also appreciate that other coating, dicing, cutting, fluxing, lapping and singulating process can be employed without departing from the present invention. Such alternative methodologies should be considered equivalents. While the invention has been described in conjunction with specific embodiments, it is evident that many alternatives, modifications, permutations and variations will become apparent to those of ordinary skill in the art in light of the foregoing description. Accordingly, it is intended that the present invention embrace all such alternatives, modifications and variations as fall within the scope of the appended claims.

What is claimed is:

1. A method for providing an underfill material on an integrated circuit chip and for singulating the chip from a wafer, comprising the following steps in the order named:
   a. providing a wafer having a front side and a back side, the wafer containing at least one integrated circuit chip, the integrated circuit chip having a plurality of solder bumps on said front side of the wafer;
   b. cutting said front side of the wafer to form channels that define edges on said at least one integrated circuit chip, the cutting being of a depth which does not cut completely through the wafer;
   c. coating said front side of the wafer with an underfill material;
   d. lapping the back side of the wafer to reduce the thickness of the wafer sufficient to cause the channels to extend from the front side to the back side; and
   e. wherein the underfill material coated on the front side remains affixed to the integrated circuit chip.

2. The method as recited in claim 1, further comprising, after step (c), a step of providing a coating of a fluxing agent on the plurality of solder bumps.

3. The method as recited in claim 2, wherein the step of providing a coating of flux occurs immediately after step (c) and prior to step (d).

4. The method as recited in claim 1, wherein the underfill material is deposited into the channels and onto said edges of the integrated circuit chip during the step of coating.

5. The method as recited in claim 1, wherein the step of lapping comprises grinding, polishing or lapping the back side of the wafer.

6. The method as recited in claim 1, wherein the step of coating comprises coating by dipping, spraying, or printing a liquid material, or laminating a film.

7. The method as recited in claim 1, wherein the integrated circuit is a flip chip integrated circuit.

8. The method as recited in claim 1, wherein the underfill material is selected from the group consisting of epoxies, polyimides, and silicone-polyimide copolymers.

9. The method as recited in claim 1, wherein the (c) step of coating further comprises coating each of said solder bumps.

10. The method as recited in claim 1, wherein the (c) step of coating comprises leaving a portion of each of said solder bumps uncoated.

11. A method for providing an underfill material on an integrated circuit chip, comprising the following steps in the order named:
   a. providing a wafer having a front side and a back side, the wafer containing at least one integrated circuit chip, the integrated circuit chip having a plurality of solder bumps on said front side of the wafer;
   b. cutting said front side of the wafer to form channels that define edges on said at least one integrated circuit chip, the cutting being of a depth which does not cut completely through the wafer;
   c. coating said front side of the wafer with an underfill material so as to leave a portion of each of said solder bumps uncoated;
   d. removing material from the back side of the wafer to reduce the thickness of the wafer sufficiently to cause the channels to extend from the front side to the back side;
   e. singulating the wafer by cutting underfill material in the channels sufficient to singulate the integrated circuit chip from the wafer; and
   f. wherein the underfill material coated on the front side remains affixed to the singulated integrated circuit chip.

12. The method as recited in claim 11, further comprising, after step (c), a step of providing a coating of flux on said uncoated portion of the solder bumps.

13. The method as recited in claim 12, wherein the step of providing a coating of flux further comprises providing a coating of flux on the underfill material.

14. The method as recited in claim 12, wherein the step of providing a coating of flux occurs immediately after step (c) and prior to step (d).

15. The method as recited in claim 11, wherein the underfill material is deposited into the channels and onto said edges of the integrated circuit chip during the step of coating.

16. The method as recited in claim 15, wherein underfill material remains coated on said edges of the integrated circuit chip after the step of singulating.

17. The method as recited in claim 11, wherein the step of singulating comprises cutting the underfill material with a laser or slicing or sawing the underfill material.

18. The method as recited in claim 11, wherein the step of removing material from the back side of the wafer comprises grinding, polishing or lapping the back side of the wafer.

19. The method as recited in claim 11, wherein the step of coating comprises coating by dipping, spraying or printing a liquid material, or laminating a film.

20. The method as recited in claim 11, wherein the integrated circuit is a flip chip integrated circuit.

21. The method as recited in claim 11, wherein the underfill material is selected from the group consisting of epoxies, polyimides, and silicone-polyimide copolymers.

22. The method as recited in claim 11, wherein the step of cutting comprises sawing.

23. A wafer level method for providing a layer of underfill adhesive on an integrated circuit having an active surface that includes solder balls on electrically conductive pads, comprising:
   providing a silicon wafer containing one or more of the integrated circuits;
   cutting the active surface of the wafer to form channels that define edges on the integrated circuit, the cutting being of a depth which does not penetrate completely through the wafer;
   forming a layer of underfill adhesive on the active surface of the integrated circuit and in the channels, wherein at least some portion of most of the solder balls remain uncovered;
   partially curing the underfill adhesive;
   removing silicon from the back side of the wafer sufficient to cause the channels to penetrate completely through the wafer; and
   cutting the underfill adhesive contained in the channels to singulate at least one integrated circuit chip having an underfill material on its active surface and edges.

24. The method as recited in claim 23, further comprising a step of providing a coating of flux on said uncoated portion of the solder bumps.

25. The method as recited in claim 23, wherein the step of providing a coating of flux further comprises providing a coating of flux on the underfill material.

26. The method as recited in claim 23, wherein the step of removing silicon from the back side of the wafer comprises grinding, polishing or lapping the back side of the wafer.

27. A method of providing a layer of underfill adhesive on a wafer having an array of bumped integrated circuits, each circuit having an active surface that includes solder balls on electrically conductive pads, comprising:

dicing the wafer on the bumped side to form grooves having a predetermined depth that is less than the thickness of the wafer;

coating the wafer with an underfill material so as to cover the active surface and fill the grooves with the underfill material;

polishing the side of the wafer opposite the active surface until the diced grooves extend completely through the wafer; and cutting through the underfill material in the grooves to singulate the array of bumped integrated circuits.

* * * * *

UNITED STATES PATENT AND TRADEMARK OFFICE
CERTIFICATE OF CORRECTION

| | | |
|---|---|---|
| PATENT NO. | : 6,649,445 B1 | Page 1 of 1 |
| APPLICATION NO. | : 10/241265 | |
| DATED | : November 18, 2003 | |
| INVENTOR(S) | : Jing Qi et al. | |

It is certified that error appears in the above-identified patent and that said Letters Patent is hereby corrected as shown below:

On the first page, Item (75) Inventors:

Change "Schaumburg" to --Lake Zurich--

Signed and Sealed this
Tenth Day of May, 2011

David J. Kappos
*Director of the United States Patent and Trademark Office*